United States Patent
Buck et al.

(10) Patent No.: US 11,143,681 B2
(45) Date of Patent: Oct. 12, 2021

(54) METHOD AND DEVICE FOR DETERMINING A SENSOR COIL INDUCTANCE

(71) Applicant: Robert Bosch GmbH, Stuttgart (DE)

(72) Inventors: Thomas Buck, Tamm (DE); Andreas Merz, Freiberg Am Neckar (DE); Stefan Leidich, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 334 days.

(21) Appl. No.: 15/754,136

(22) PCT Filed: Jun. 27, 2016

(86) PCT No.: PCT/EP2016/064824
§ 371 (c)(1),
(2) Date: Feb. 21, 2018

(87) PCT Pub. No.: WO2017/036626
PCT Pub. Date: Mar. 9, 2017

(65) Prior Publication Data
US 2018/0238945 A1    Aug. 23, 2018

(30) Foreign Application Priority Data

Aug. 28, 2015   (DE) .................... 10 2015 216 479.9

(51) Int. Cl.
*G01R 27/26*   (2006.01)
*G01D 5/20*    (2006.01)

(52) U.S. Cl.
CPC ........... *G01R 27/2611* (2013.01); *G01D 5/20* (2013.01)

(58) Field of Classification Search
CPC .............................. G01R 27/2611; G01D 5/20
See application file for complete search history.

(56) References Cited

U.S. PATENT DOCUMENTS

| | | | | |
|---|---|---|---|---|
| 6,208,134 B1* | 3/2001 | Demma | ................ | G01B 7/023 324/207.12 |
| 6,208,497 B1* | 3/2001 | Seale | .................... | H02P 25/032 361/160 |
| 2003/0102197 A1* | 6/2003 | Furuya | .................. | G07D 5/005 194/318 |

(Continued)

FOREIGN PATENT DOCUMENTS

| | | |
|---|---|---|
| DE | 197 38 836 A1 | 3/1999 |
| DE | 103 12 436 A1 | 10/2004 |

(Continued)

OTHER PUBLICATIONS

International Search Report corresponding to PCT Application No. PCT/EP2016/064824, dated Sep. 22, 2016 (German and English language document) (5 pages).

*Primary Examiner* — Patrick Assouad
*Assistant Examiner* — Haidong Zhang
(74) *Attorney, Agent, or Firm* — Maginot, Moore & Beck LLP

(57) ABSTRACT

A method for determining a sensor coil inductance of an eddy current sensor using an LC oscillator circuit includes determining the sensor coil inductance via integration, as a function of an oscillation frequency and a resonance capacitance of the LC oscillator circuit. The method further includes detuning, at least once, the oscillation frequency during the integration.

11 Claims, 4 Drawing Sheets

(56) References Cited

U.S. PATENT DOCUMENTS

2016/0041233 A1* 2/2016 Li .................... G01R 33/0017
                                                    324/346
2016/0054153 A1* 2/2016 Sun .................... G01D 5/2006
                                                    324/207.12

FOREIGN PATENT DOCUMENTS

| DE | 10 2004 033 085 A1 | 1/2006 |
| DE | 10 2005 003 904 A1 | 10/2006 |
| DE | 10 2008 012 922 A1 | 9/2009 |
| EP | 1 032 109 A2 | 8/2000 |

\* cited by examiner

METHOD AND DEVICE FOR DETERMINING A SENSOR COIL INDUCTANCE

This application is a 35 U.S.C. § 371 National Stage Application of PCT/EP2016/064824, filed on Jun. 27, 2016, which claims the benefit of priority to Serial No. DE 10 2015 216 479.9, filed on Aug. 28, 2015 in Germany, the disclosures of which are incorporated herein by reference in their entirety.

The disclosure relates to a method and a device for determining a sensor coil inductance of an eddy current sensor by means of an LC oscillator circuit, wherein the sensor coil inductance is determined via integration, as a function of an oscillation frequency and a resonance capacitance of the LC oscillator circuit.

BACKGROUND

The method and the device of the kind initially specified are generally known from the prior art. Various inductive rotation angle sensors are known for determining a rotation angle position, for example, of a rotor of an electric machine. The coupling between an excitation coil and one or multiple sensor coils is predominantly affected by the rotation angle position of a coupling element, for example, of the rotor shaft of the electric machine. A corresponding approach is, for example, disclosed in the unexamined patent application DE 197 388 36 A1. The evaluation of coupling factors requires complex electronics. In this case, the coil system is excited by a high-frequency signal, whereby simple spiral coils emit electromagnetic fields. For the functioning of such a sensor, this emission is required at least in the near field. However, in the far field or far range, the magnetic field is no longer required for the function. However, the field in the far range may result in an electromagnetic incompatibility in the environment.

Even more than the emission, the coupling of interference signals poses a problem. In a simple spiral coil which is subjected to a magnetic alternating field, a voltage is induced which may enter into a disadvantageous interaction with the sensor electronics.

In order to solve this problem, it is already known from the unexamined patent application DE 10 2008 012 922 A1 to provide loops in the coil having a different winding sense, so that the magnetic fields in the far range offset one other and induced voltages neutralize one another.

Alternatively, it is known the inductance of one or multiple sensor coils of the sensor are determined. Based on the inductances of individual coils, the measured rotation angle may be easily deduced. Generally, the determination of an inductance is carried out via the measurement and integration of an oscillation frequency of an LC oscillator circuit, wherein the oscillation frequency is a function of the inductance. Correspondingly, the detected oscillation frequency may also be affected by an externally induced voltage, so that the oscillation frequency is no longer only a function of the LC resonance condition, but also of the frequency of the external interference signal inducing the voltage. By dividing the sensor coils into two parts and inverting the winding sense, this coupling may be reduced. However, due to this measure, the inductance, which, however, definitively determines the coil quality and thus the frequency stability, is also generally reduced.

SUMMARY

The method according to the present disclosure having the features of claim 1 has the advantage that stable operation of the eddy current sensor may be ensured via an exact determination of the sensor coil inductance, taking into consideration electromagnetic compatibility, without complex adaptation of the sensor coil design. According to the present disclosure, it is provided for this purpose that during the integration for determining the sensor coil inductance, the oscillation frequency is detuned at least once. By means of a deliberate detuning of the oscillation frequency, it is achieved that an induced voltage due to an interference signal or an interference frequency does not result in an erroneous counter value of the integration.

As a result, the determination of the coil inductance is not impaired or is hardly impaired by the interference signal.

Furthermore, it is provided that for detuning the oscillation frequency, the resonance capacitance is changed at least once. By influencing and changing the resonance capacitance, the oscillation behavior of the LC oscillator circuit may be impaired in a simple manner, in order to change or to detune the oscillation frequency.

In particular, it is provided that the resonance capacitance is increased at least once by a predefinable value. As a result, the to-be-detected oscillation frequency absence time of the increased resonance capacitance is selectively decreased, and "injection locking" due to the induced external voltage or the interference signal is thereby prevented.

Furthermore, it is provided that alternatively, the resonance capacitance is continuously increased. For this purpose, preferably, the resonance capacitor of the LC oscillator circuit is continuously modulated during the integration, in particular corresponding to a curve acting linearly on the frequency. Here as well, the aforementioned advantages result. The counter value of the integration is then not affected or is hardly affected by the interference signal.

Particularly preferably, the resonance capacitance is increased by additionally connecting at least one additional capacitor. In particular, it may be provided that a capacitor array or capacitor field is configured in an integrated circuit having a plurality of identical and/or different capacitors, which are connectable and thereby additionally connectable to the LC oscillator circuit, in particular to the resonator or the resonance capacitor, via semiconductor switches. The continuous or quasi-continuous increasing of the resonance capacitance may thus also be achieved via a plurality of additionally connectable individual capacitances or capacitors.

According to one preferred refinement of the present disclosure, it is provided that for detuning the oscillation frequency, alternatively or in addition, a gate delay of a digital inverter of the oscillator of the LC oscillator circuit is changed. The gate delay also affects the oscillation frequency of the LC oscillator circuit. By changing the gate delay, a phase shift may be achieved which changes or detunes the oscillation frequency. By influencing the oscillation frequency by changing the gate delay, additional connectable capacitors may be dispensed with, and the manufacturing complexity may therefore be reduced. Preferably, the gate delay is achieved by using a programmable current source for setting bias currents for amplifier stages. A cascade of delay elements may also be connected in series in order to detune the oscillation frequency.

According to one preferred refinement of the present disclosure, it is provided that the resonance capacitance is increased as a function of an expected interference frequency. As a result, the method may, for example, be optimized for use in a specific environment in which at least one interference signal or one interference frequency is expected due to an electrical/electronic device. As a result, selective detuning of the oscillation frequency is achieved, which ensures a reliable determination of the coil inductance.

The device according to the present disclosure having the features of claim 8 is characterized by a specially arranged control unit which carries out the method according to the present disclosure under normal use. The aforementioned advantages thereby result. Additional advantages and preferred features result from the previously description and from the claims.

Preferably, it is provided that the LC oscillator circuit has at least one additionally connectable capacitor for increasing the resonance capacitance or for influencing/detuning the oscillation frequency. In particular, multiple capacitors, as already described, are configured and, for example, are additionally connectable via semiconductor switches.

Alternatively or in addition, it is preferably provided that the LC oscillator circuit includes an oscillator having a digital inverter with variable gate delay. As described above, by influencing the gate delay, the oscillating frequency is detuned and the coil inductance is thereby determined, and a more reliable and accurate operation of the eddy current sensor in particular as a rotation angle sensor is ensured.

BRIEF DESCRIPTION OF THE DRAWINGS

The present disclosure and its advantages are to be explained in greater detail based on exemplary embodiments. The following are shown.

DETAILED DESCRIPTION

Figure 1:
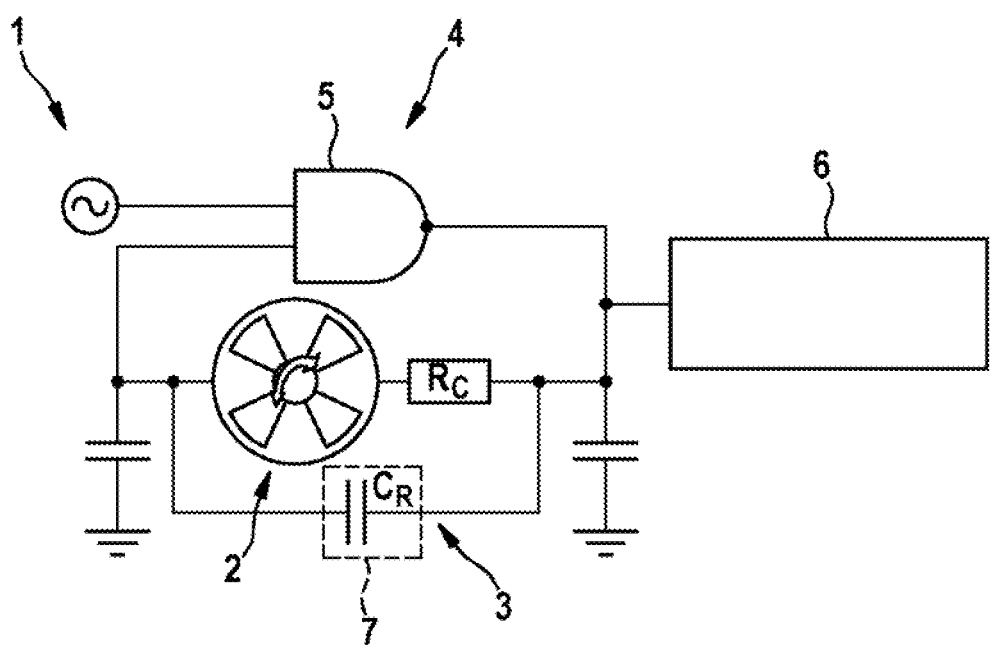
FIG. 1 shows a simplified depiction of a device for operating an eddy current sensor.

FIG. 1 shows a simplified depiction of a device 1 for operating an eddy current sensor 2 which is used as a rotation angle sensor, in particular for determining a coil inductance of the eddy current sensor 2. The device 1 has an LC oscillator circuit 3 for detecting the coil inductance of the eddy current sensor 2. For this purpose, the oscillator circuit 3 has an inductance L of the eddy current sensor 2 or its sensor coils, an internal resistance $R_C$ of the eddy current sensor 2, and a resonance capacitor $C_R$. Furthermore, the circuit 3 includes an oscillator 4 having a digital inverter 5. A module 6 calculates a rotation angle, for example, of the rotor of an electric motor, which is detected by the eddy current sensor 2, from the oscillating frequency f generated in the circuit 3. The circuit 3 oscillates at the LC resonant frequency. Digitization and determination of the coil inductance are preferably carried out by counting the periods within an integration period $t_{int}$.

Figure 2A:
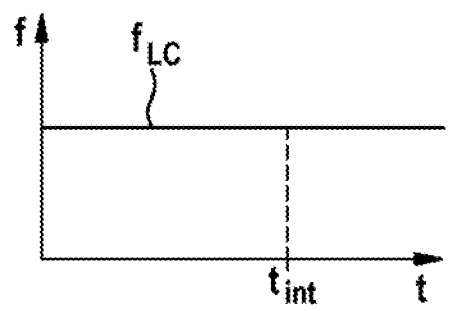
FIGS. 2A to 2D show oscillating frequencies of the sensor without and with an interference signal.
Figure 2B:
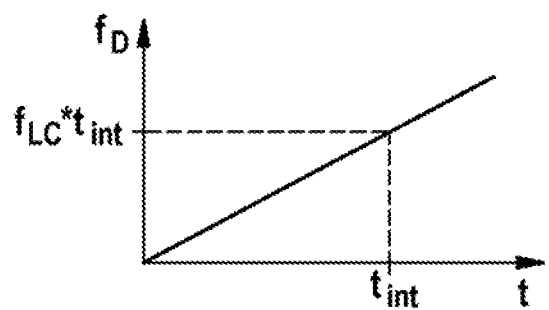
Figure 2C:
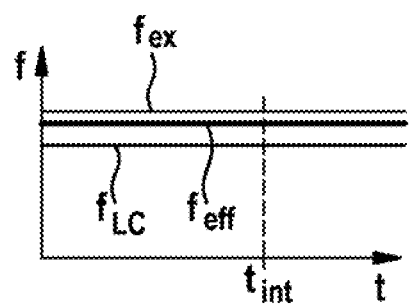
Figure 2D:
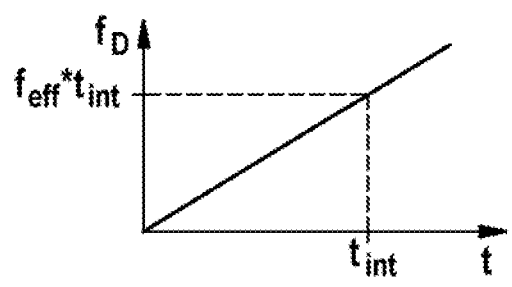
Figure 3A:
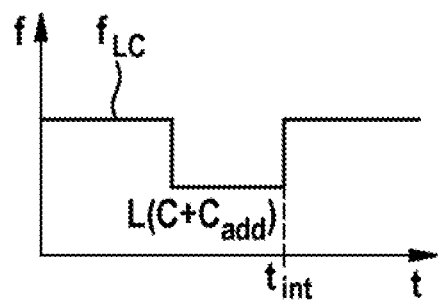
FIGS. 3A to 3D show oscillating frequencies of the sensor when carrying out an advantageous operating method.
Figure 3B:
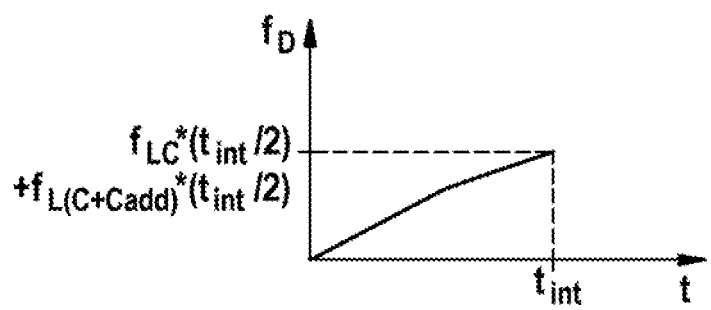
Figure 3C:
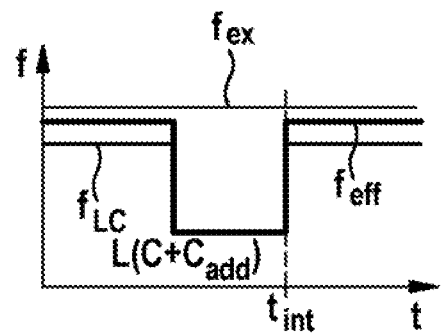
Figure 3D:
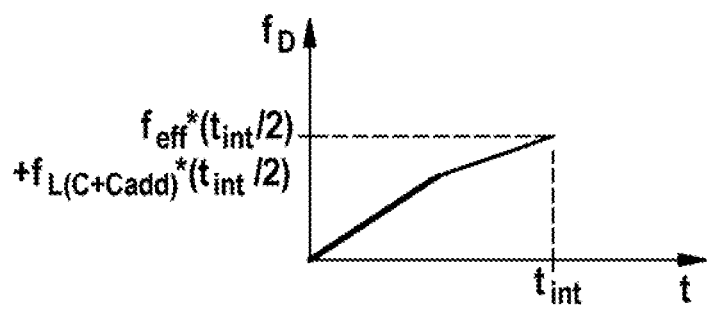

FIGS. 2A and 2C show the curve of the oscillation frequency f over the integration period $t_{int}$, wherein according to FIG. 2A, no interference signal is present, and wherein FIG. 2C shows the case of when an interference signal $S_{ex}$ is present. Furthermore, FIGS. 2B and 2D shows the digitized frequency $f_D$ which results from the integration. In this case, it is assumed that the interference signal $S_{ex}$ is a CW signal and has an interference frequency $f_{es}$ which, for example, differs from the LC resonant frequency $f_{LG}$ by 100 kHz. Assuming a temporally constant value of the resonance capacitance of the capacitor $C_R$, the oscillation frequency f corresponds either to the LC resonant frequency $f_{LC}$ if no interference signal $S_{ex}$ is present, or an effective frequency $f_{eff}$ which lies between the LC resonant frequency and the frequency of the interference signal $S_{ex}$. It is obvious that counting the periods under the influence of the interference signal $S_{ex}$ results in a counter value which differs from the interference-free situation. By means of the method described below, the advantageous operation, and the advantageous circuit configuration of the device 1, it is achieved that the influence of the interference signal $S_{ex}$ does not result in an erroneous counter value (digitized frequency $f_D$), and thus has no influence or at least a reduced influence on the rotation angle ascertained by means of the eddy current sensor 2. Advantageously, the circuit 3 according to a first exemplary embodiment has a plurality of capacitors, in particular in the form of a capacitor array 7 as indicated in FIG. 1, which are configured in an integrated circuit and are connectable via semiconductor switches of the resonant circuit or to the resonator of the circuit 3 and are additionally connectable to the resonance capacitor $C_R$. For this purpose, for example, metal-dielectric-metal capacitors are fabricated in the back-end process of the manufacture of the integrated circuit. At least one additional capacitor is additionally connectable to the circuit 3 or to the resonance capacitor $C_R$.

If only one additional capacitor is provided and additionally connectable, then the method shown in FIGS. 3A to 3D may be carried out. In this case, it is provided that during the integration, the checking of the sensor coil of the eddy current sensor 2 for half the integration period ($t_{int}/2$) is compensated for by the resonance capacitor $C_R$ or by the resonance capacitance thereby formed. In the second half of the integration period, the sensor coil is compensated for by additionally connecting the additional capacitor having an additional capacitance ($C_R+C_{add}$) The additional capacitance $C_{add}$ is preferably selected in such a way that the original resonant frequency is shifted by significantly more than the locking range of the injection locking. Advantageously, the capacitances are chosen as follows: $C_R$=68 pF and $C_{add}$=5 pF. In the case of planar coils on a printed circuit board base which is approximately 5 mm in size, the locking range of the injection locking is typically less than 100 kHz. By additionally connecting the additional capacitor, the interference due to the interference signal $S_{ex}$ may be prevented for at least half the integration time. The measurement error (frequency error) when determining the coil inductance may thus be halved. If the circuit 3 has multiple additionally connectable capacitors, it is possible to introduce additional stages and thus further reduce the time span of the possible interference due to the interference signal $S_{ex}$.

Figure 4A:
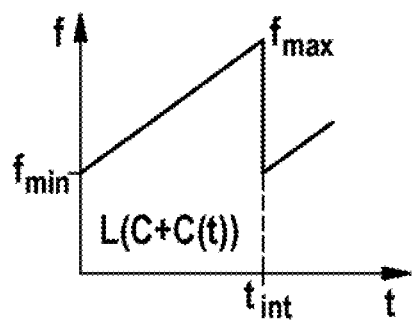
FIGS. 4A to 4D show oscillating frequencies of the sensor when carrying out an alternative operating method.
Figure 4B:
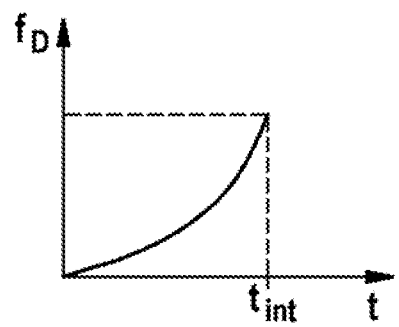
Figure 4C:
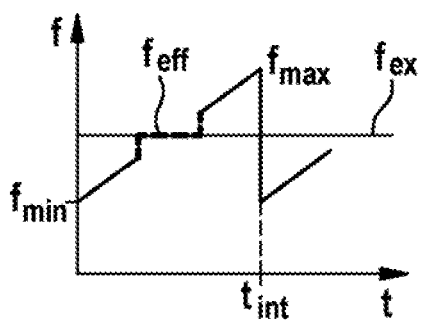
Figure 4D:
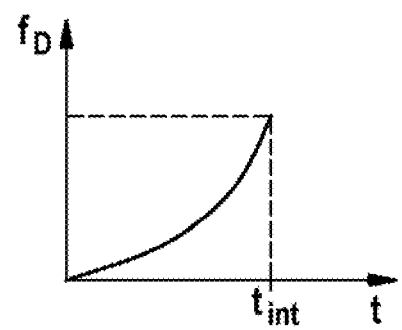

FIGS. 4A to 4D show an additional exemplary embodiment, in which the oscillation frequency $f_{LC}$ is continuously modulated during the integration, for example, corresponding to a curve acting linearly on the frequency, as shown in FIG. 4A. In the case of linear modulation and under the assumption that the frequency $f_{ex}$ of the interference signal $S_{ex}$ lies between $f_{min}$ and $f_{max}$, the counter reading is not affected the interference signal $S_{ex}$ during integration. Locking onto the interference signal $S_{ex}$ causes an increase in the oscillation frequency $f_{LC}$, if the LC resonant frequency $f_{LC}$ is lower than the frequency of the interference signal and the frequency spacing is less than the locking range. Likewise, there is a phase in which the LC resonant frequency $f_{LC}$ is higher than the interference frequency $f_{ex}$. The interference is compensated for by the integration, and the inactivity of the sensor coil is very accurately determined, so that an exact determination of the rotation angle is ensured.

In the case that the interference frequency $f_{ex}$ of the interference signal $S_{ex}$ is very close to $f_{min}$ and $f_{max}$, interference may still occur, since the interference signal only increases or only reduces the LC resonant frequency $f_{LC}$. In any case, the interference is, however, significantly less than in the normal case with a constant value of the resonance capacitor $C_R$. In the specific example, the expected angle error may be reduced from 0.5° to 0.2° if the compensation capacitance or the capacitance of the resonance capacitor is varied between 61.9 pF and 63.1 pF. A variation by 1 pF reduces the error to 0.1°, and in the case of a variation of 5 pF, the error is no longer measurable.

The linear or quasi-linear curve or the continuous variation of the oscillation frequency by changing the resonance capacitor may be achieved via the plurality of individual capacitors which are additionally connectable, as previously described. Advantageously, the capacitors are configured having capacitance values corresponding to a binary pattern, so that the capacitor have capacitances of 0.1 pF, 0.2 pF, 0.4 pF, 0.8 pF, .... By means of a selected combination, all values between 0 pF and twice the maximum value minus the increment may be set, in steps of 0.1 pF. The use of analog adjustable capacitors (varactors) is also possible in order to detune the oscillation frequency of the circuit 3.

The detuning of the oscillation frequency during the integration may also be achieved without changing the compensation capacitance. In the present case, in which the circuit is implemented via an oscillator having a digital inverter 5, the resulting gate delay has an influence on the oscillation frequency. An oscillation is then sustained if the signal at the output of the inverter 5 is supplied to the input having a phase delay of −180°. The resonance capacitor $C_R$ or the LC resonator has precisely this phase shift at the resonant frequency. At a specific oscillation frequency, a phase shift may be converted into a time delay. In the case of 25 MHz, the period duration is 40 ns. A phase shift of −180° thus corresponds to 20 ns. The gate delay is generally 1 to 6 ns. This time delay acts to reduce the required phase shift of the resonator. Specifically, this means that at 2 ns (corresponding to −18°), the gate delay and the resonator must have a phase shift of only −182°. In the case of a specific allocation with values for the inductance L and the resonance capacitor $C_R$, the oscillation frequency falls, since this smaller phase shift is reached at a lower frequency, because the phase response of the pi resonator changes from 0° to −180° at the resonant frequency. The slope is a function of the coil quality. The gate delay thus has a well-defined influence on the oscillation frequency, so that by influencing the gate delay, the oscillation frequency may be detuned without the resonance capacitance having to be changed in addition.

Influencing the gate delay may, for example, be practically achieved by using a programmable current source for setting the bias currents of amplifier stages. Furthermore, in addition or alternatively, a cascade of delay elements may be connected in series in an integrated circuit.

By means of the advantageous device and the described method, it is thus possible to selectively detune the oscillation frequency of the circuit in order to prevent the oscillation frequency from locking onto an interference signal. As a result, by means of the device 1, requirements for electromagnetic compatibility and robustness with respect to interference signals may be met in a simple and economical manner.

The invention claimed is:

1. A method for determining a sensor coil inductance of an eddy current sensor using an LC oscillator circuit, the method comprising:
   determining the sensor coil inductance via integration during an integration period, as a function of an oscillation frequency and a resonance capacitance of the LC oscillator circuit;
   detuning, at least once, the oscillation frequency at least once during the integration period such that the oscillation frequency is different than a current resonant frequency of the oscillation circuit; and
   changing a gate delay of a digital inverter of an oscillator for detuning the oscillation frequency,
   wherein the LC oscillator circuit includes the eddy current sensor such that the sensor coil inductance of the eddy current sensor and an internal resistance of the eddy current sensor are each properties of the LC oscillator circuit, and
   wherein the LC oscillator circuit includes a resonance capacitor having the resonance capacitance.

2. The method as claimed in claim 1, further comprising:
   changing, at least once, the resonance capacitance for detuning the oscillation frequency.

3. The method as claimed in claim 1, further comprising:
   increasing, at least once by a predefinable value, the resonance capacitance.

4. The method as claimed in claim 1, further comprising:
   increasing continuously the resonance capacitance.

5. The method as claimed in claim 1, further comprising:
   increasing the resonance capacitance by additionally connecting at least one additional capacitor.

6. The method as claimed in claim 1, further comprising:
   increasing the resonance capacitance as a function of an expected interference frequency.

7. A device for determining a sensor coil inductance of an eddy current sensor, comprising:
   an LC oscillator circuit including at least one resonance capacitor;
   a detection device configured to detect an oscillation frequency of the LC oscillator circuit; and
   a specifically arranged control unit configured to:
      determine the sensor coil inductance via integration, as a function of an oscillation frequency and a resonance capacitance of the LC oscillator circuit; and
      detune, at least once, the oscillation frequency during the integration,
   wherein the LC oscillator circuit further includes an oscillator having a digital inverter and a changeable gate delay.

8. The device as claimed in claim 7, wherein the LC oscillator circuit further includes at least one additionally connectable capacitor configured to increase the resonance capacitance.

9. A method for determining a sensor coil inductance of an eddy current sensor using an LC oscillator circuit, the method comprising:
   determining the sensor coil inductance via integration, as a function of an oscillation frequency and a resonance capacitance of the LC oscillator circuit;
   detuning, at least once, the oscillation frequency during the integration; and
   changing a gate delay of a digital inverter of an oscillator for detuning the oscillation frequency,
   wherein the LC oscillator circuit includes the eddy current sensor such that the sensor coil inductance of the eddy current sensor and an internal resistance of the eddy current sensor are each properties of the LC oscillator circuit, and wherein the LC oscillator circuit includes a resonance capacitor having the resonance capacitance.

10. A method for determining a sensor coil inductance of an eddy current sensor using an LC oscillator circuit, the method comprising:

determining the sensor coil inductance via integration, as a function of an oscillation frequency and a resonance capacitance of the LC oscillator circuit;

detuning, at least once, the oscillation frequency during the integration; and increasing the resonance capacitance as a function of an expected interference frequency, wherein the LC oscillator circuit includes the eddy current sensor such that the sensor coil inductance of the eddy current sensor and an internal resistance of the eddy current sensor are each properties of the LC oscillator circuit, and wherein the LC oscillator circuit includes a resonance capacitor having the resonance capacitance.

11. A method for determining a sensor coil inductance of an eddy current sensor using an LC oscillator circuit, the method comprising:

determining the sensor coil inductance via integration during an integration period, as a function of an oscillation frequency and a resonance capacitance of the LC oscillator circuit;

detuning, at least once, the oscillation frequency at least once during the integration period such that the oscillation frequency is different than a current resonant frequency of the oscillation circuit; and increasing the resonance capacitance as a function of an expected interference frequency, wherein the LC oscillator circuit includes the eddy current sensor such that the sensor coil inductance of the eddy current sensor and an internal resistance of the eddy current sensor are each properties of the LC oscillator circuit, and wherein the LC oscillator circuit includes a resonance capacitor having the resonance capacitance.

* * * * *